*US009231717B2*

United States Patent
Hotta et al.

(10) Patent No.: US 9,231,717 B2
(45) Date of Patent: *Jan. 5, 2016

(54) SEMICONDUCTOR DEVICE AND SIGNAL PROCESSING METHOD THEREOF

(71) Applicant: Renesas Electronics Corporation, Kawasaki-shi, Kanagawa (JP)

(72) Inventors: Yoshihiko Hotta, Tokyo (JP); Seiichi Saito, Tokyo (JP); Kazushige Yamagishi, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/694,158

(22) Filed: Apr. 23, 2015

(65) Prior Publication Data

US 2015/0229419 A1 Aug. 13, 2015

Related U.S. Application Data

(63) Continuation of application No. 14/272,316, filed on May 7, 2014, now Pat. No. 9,036,093, which is a continuation of application No. 13/767,926, filed on Feb. 15, 2013, now Pat. No. 8,767,131.

(30) Foreign Application Priority Data

Mar. 15, 2012 (JP) ................................. 2012-058632

(51) Int. Cl.
*H04N 5/50* (2006.01)
*H04N 5/46* (2006.01)
(Continued)

(52) U.S. Cl.
CPC ............. *H04H 40/18* (2013.01); *H04B 1/1638* (2013.01); *H04H 40/27* (2013.01); *H04N 5/50* (2013.01);
(Continued)

(58) Field of Classification Search
CPC ........ H04N 21/44209; H04N 5/50; H03J 3/28
USPC ......... 348/731, 729, 725, 726, 720, 705, 706; 375/316, 328; 455/178.1, 187.1, 191.1
See application file for complete search history.

(56) References Cited

U.S. PATENT DOCUMENTS 8,023,798 B2 * 9/2011 Hagiwara et al. ............. 386/248
2008/0250463 A1 10/2008 Shibusawa et al.
(Continued)

FOREIGN PATENT DOCUMENTS

JP 2007-214675 A 8/2007
JP 2008-193654 A 8/2008
(Continued)

OTHER PUBLICATIONS

Office Action mailed Jun. 16, 2015 for related Japanese Patent Application No. 2012-058632.
(Continued)

*Primary Examiner* — Jefferey Harold
*Assistant Examiner* — Jean W Desir
(74) *Attorney, Agent, or Firm* — Miles & Stockbridge P.C.

(57) ABSTRACT

A semiconductor device includes a one-segment tuner I/F that is connected to a one-segment tuner, a tuner I/F that is connected to a digital terrestrial tuner, a decoder that selectively decodes a first broadcast signal supplied from the one-segment tuner I/F and a second broadcast signal supplied from the tuner I/F, a general purpose processor that is provided separately from the decoder and decodes the first broadcast signal, and a switch unit that, based on signal intensity of the second broadcast wave, switches the decoding by the decoder between the first broadcast signal and the second broadcast signal while the general purpose processor is decoding the first broadcast signal. The one-segment tuner I/F, the tuner I/F, the decoder, the general purpose processor, and the switch unit are integrated on one chip.

8 Claims, 7 Drawing Sheets

(51) Int. Cl.
  *H04H 40/18* (2008.01)
  *H04N 21/414* (2011.01)
  *H04N 21/426* (2011.01)
  *H04N 21/438* (2011.01)
  *H04N 21/442* (2011.01)
  *H04B 1/16* (2006.01)
  *H04H 40/27* (2008.01)
  *H03J 3/28* (2006.01)

(52) U.S. Cl.
  CPC ..... *H04N 21/41422* (2013.01); *H04N 21/4263* (2013.01); *H04N 21/4383* (2013.01); *H04N 21/44209* (2013.01); *H03J 3/28* (2013.01)

(56) References Cited

U.S. PATENT DOCUMENTS

2009/0238314 A1 9/2009 Imagawa et al.
2012/0320281 A1 12/2012 Kinoshita et al.

FOREIGN PATENT DOCUMENTS

JP 2010-219678 9/2010
JP 2010-258670 11/2010

OTHER PUBLICATIONS

Office Action mailed Oct. 6, 2015 for related Japanese Patent Application No. 2012-058632.

\* cited by examiner

SEMICONDUCTOR DEVICE AND SIGNAL PROCESSING METHOD THEREOF

CROSS-REFERENCE TO RELATED APPLICATIONS

This application is based upon and claims the benefit of priority from Japanese patent application No. 2012-058632, filed on Mar. 15, 2012, the disclosure of which is incorporated herein in its entirety by reference.

The present invention relates to a semiconductor device and a signal processing method thereof, and for example, to a semiconductor device including two tuner I/Fs and a signal processing method thereof.

Japanese Unexamined Patent Application Publication No. 2008-193654 discloses a digital broadcast reception circuit that switches one-segment (hereinafter referred to as 1 seg) broadcasting and twelve-segment (hereinafter referred to as 12 seg) broadcasting. For example, the reception circuit disclosed in Japanese Unexamined Patent Application Publication No. 2008-193654 starts a decode process of the 1 seg broadcasting when a reception status of the 12 seg broadcasting deteriorates.

SUMMARY

However, the present inventor has found a problem in the technique disclosed in Japanese Unexamined Patent Application Publication No. 2008-193654 that it is difficult to appropriately switch a reception process. Other issues and new features will be apparent from the description in this specification and the drawings attached herewith.

An aspect of the present invention is a semiconductor device that includes a first tuner I/F that is connected to a first tuner for turning in a first broadcast wave transferring content data, a second tuner I/F that is connected to a second tuner for tuning in a second broadcast wave transferring the content data, a decoder that selectively decodes a first broadcast signal supplied from the first tuner I/F and a second broadcast signal supplied from the second tuner I/F, a general purpose processor that is provided separately from the decoder and decodes the first broadcast signal, a switch unit that, based on signal intensity of the second broadcast wave, switches the decoding by the decoder between the first broadcast signal and the second broadcast signal while the general purpose processor is decoding the first broadcast signal. Further, the first tuner I/F, the second tuner I/F, the decoder, the general purpose processor, and the switch unit are integrated on one chip.

According to the above aspect, it is possible to provide a semiconductor device, a navigation system, and a signal processing method that can appropriately switch a reception process.

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

First Embodiment

Figure 1:
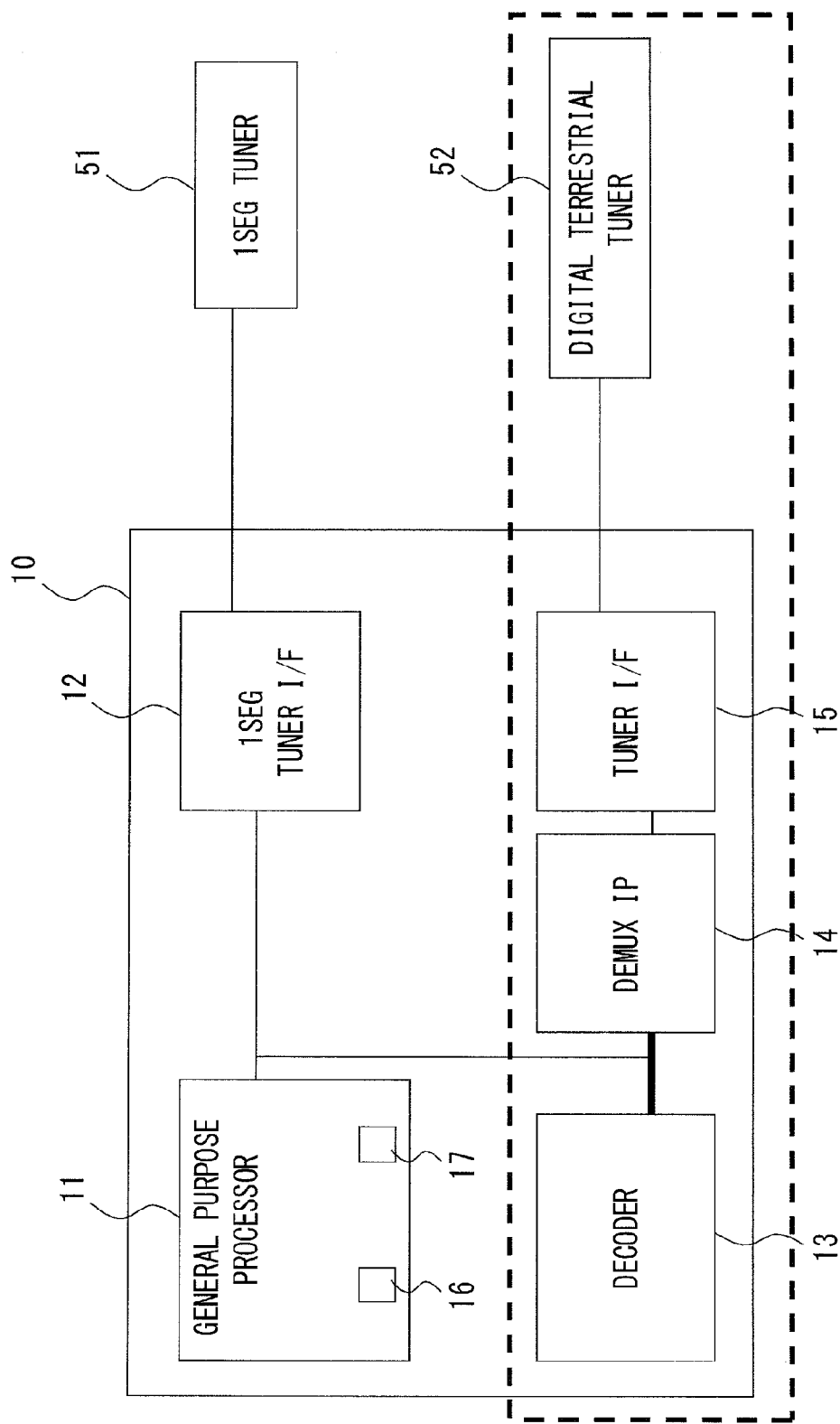
FIG. 1 is a block diagram showing a configuration of a semiconductor device according to a first embodiment.
Figure 2:
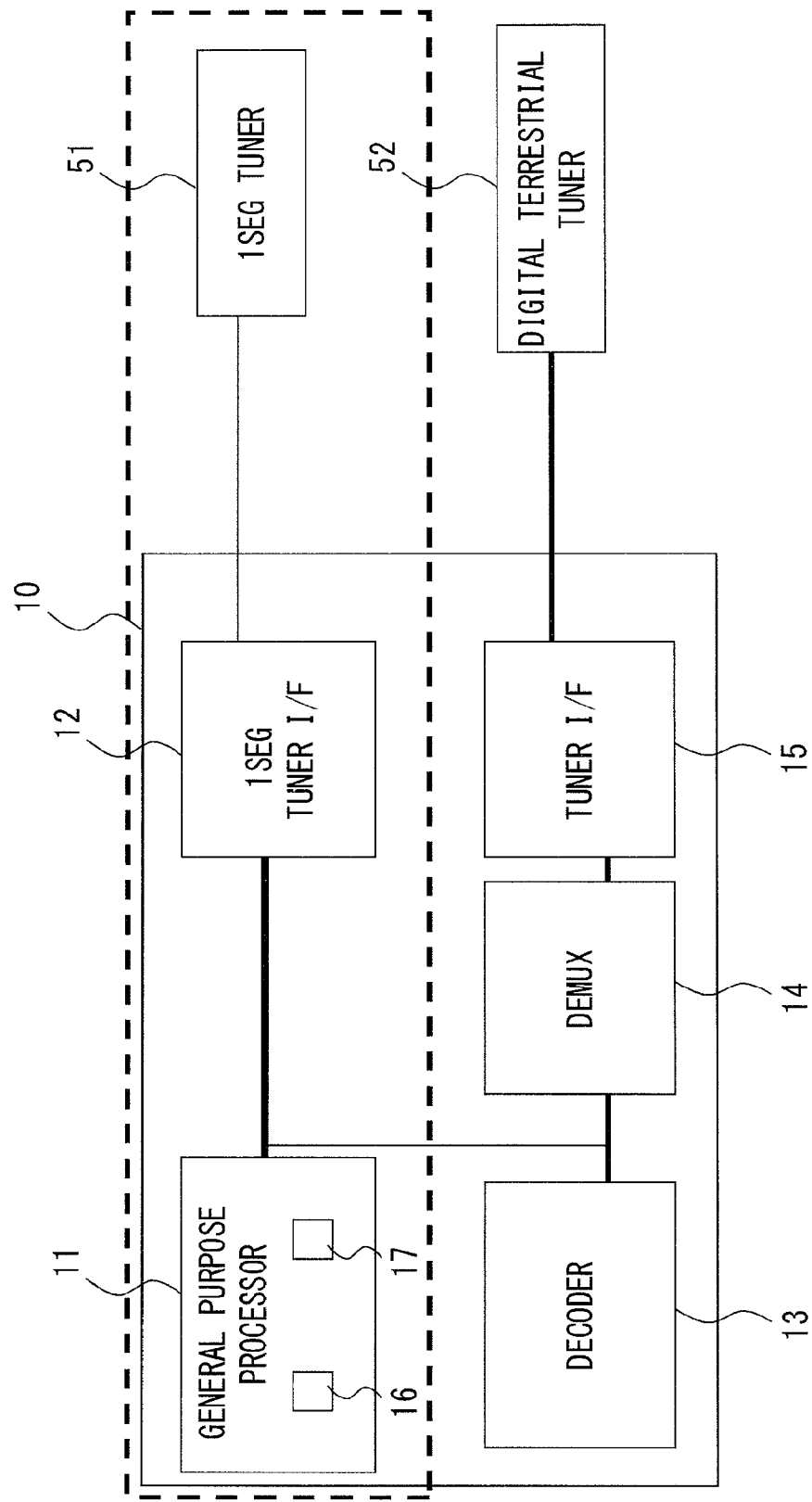
FIG. 2 is a block diagram for explaining reception switch by the semiconductor device.
Figure 3:
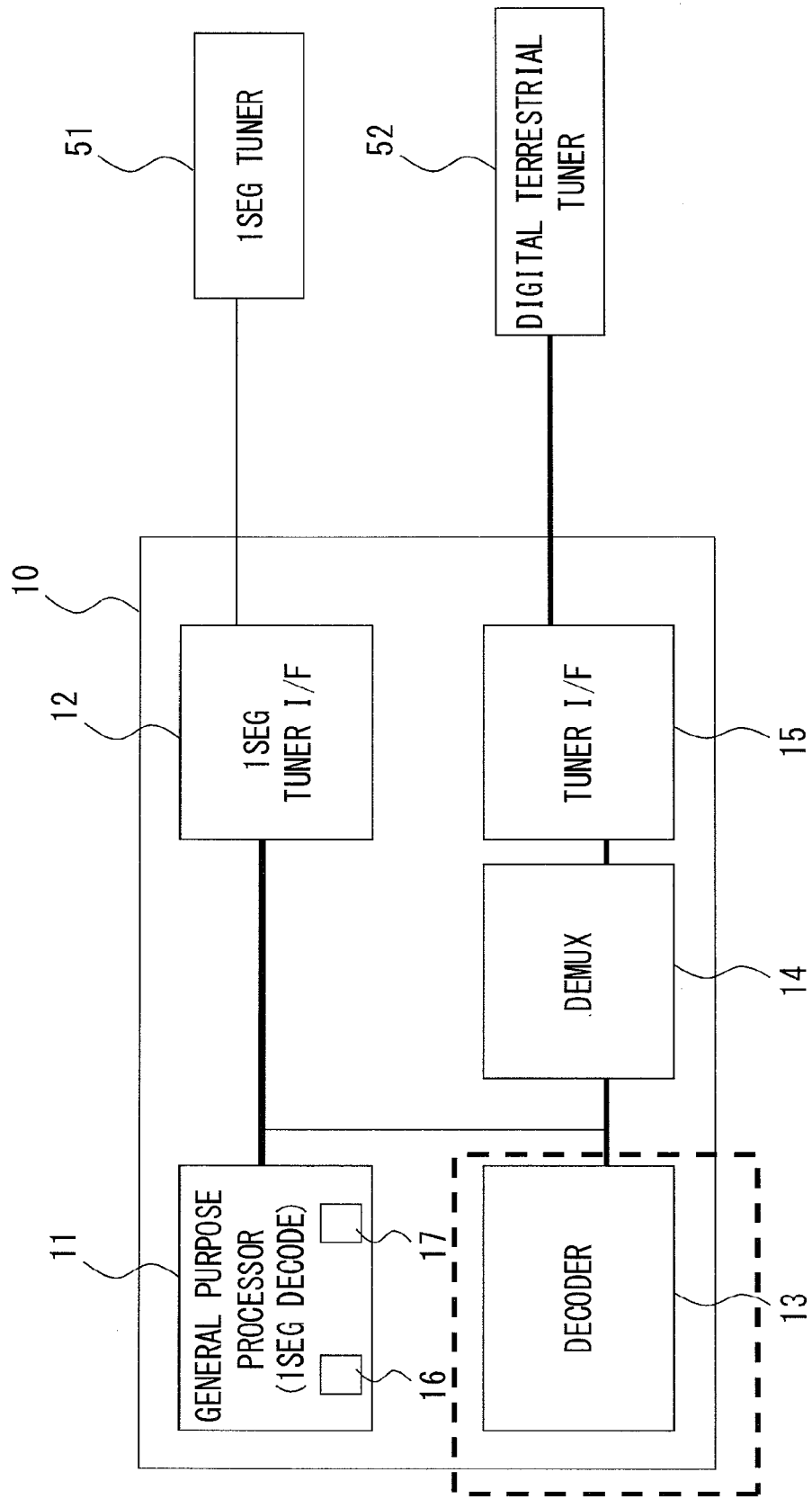
FIG. 3 is a block diagram for explaining reception switch by the semiconductor device.

Hereinafter, embodiments of the present invention are explained with reference to the drawings. FIG. 1 is a block diagram showing a configuration of a semiconductor device 10 according to this embodiment. The semiconductor device 10 includes a general purpose processor 11, a 1 seg tuner I/F (interface) 12, a decoder 13, a demultiplexer 14, and a tuner I/F (interface) 15. The semiconductor device 10 is connected to a 1 seg tuner 51 and a digital terrestrial tuner 52. The general purpose processor 11 includes a switch unit 16 and a decode unit 17.

Each block is provided as an IP (Intellectual Property) core, for example. The semiconductor devices 10 is an LSI (Large Scale Integrated circuit), such as SoC (System on Chip), and the abovementioned components are integrated on one chip. For example, the semiconductor device 10 composes a control semiconductor chip for a car navigation system mounted on a motor vehicle. The semiconductor device 10 is used for a receiver that receives digital terrestrial TV broadcasting. Further, the semiconductor device 10 switches the 1 seg broadcasting and the 12 seg broadcasting and receives broadcast waves.

The 1 seg tuner (first tuner) 51 receives 1 seg broadcast waves (first broadcast waves) of the digital terrestrial TV broadcasting and tunes therein. The 1 seg tuner 51 is connected to the 1 seg tuner I/F 12. The 1 seg tuner 51 outputs 1 seg broadcast signals (first broadcast signals) based on tuned 1 seg broadcast waves to the 1 seg tuner I/F (first tuner I/F) 12.

The digital terrestrial tuner (second tuner) 52 receives 12 seg (also referred to as 12-segment and full segment) broadcast waves (second broadcast waves) and tunes therein. The digital terrestrial tuner 52 is connected to the tuner I/F (second tuner I/F) 15. The digital terrestrial tuner 52 outputs 12 seg broadcast signals (second broadcast signals) based on the tuned 12 seg broadcast waves to the tuner I/F 15. Note that although each tuner has a demodulation function, a demodulator for demodulating the digital terrestrial broadcast signals and the 1 seg broadcast signals may be included in the semiconductor device 10 instead.

In the digital terrestrial TV broadcasting, information for one channel is divided into 13 segments to be transmitted. Twelve segments of them are used for high-definition (for example, resolution of 1920×1080 pixels at 30 frames/sec) television broadcasting (12 seg), and the remaining one segment is used for the 1 seg broadcasting (for example, resolution of 320×240 at 15 frames/sec). In this example, the 1 seg broadcast waves and 12 seg broadcast waves transfer the same content data with different resolution and frame rates. That is, the data transferred on the 1 seg broadcast waves is smaller than the data transferred on the 12 seg broadcast waves. Further, the 1 seg tuner 51 and the digital terrestrial tuner 52 tune in the same channel.

The demultiplexer 14 demultiplexes the 1 seg broadcast signals or the 12 seg broadcast signals. For example, the demultiplexer 14 separates a stream of broadcast signals into a video stream and a voice stream. The decoder 13 is an IP (Intellectual Property) core dedicated for decode processes and selectively decodes the digital terrestrial broadcast signals and the 1 seg broadcast signals. For example, the decoder 13 decodes the broadcast signals separated into the video stream and the audio stream by the demultiplexer 14. Specifically, the decoder 13 decodes an image and audio compressed in accordance with the standard such as H.264 and MPEG4. Then, the decoded video or audio signals are output to a monitor or a speaker not shown. This enables TV content of the digital terrestrial broadcasting to be displayed on the monitor. Note that several frames of overhead are necessary for interframe interpolation in H.264 and MPEG4.

Figure 5:
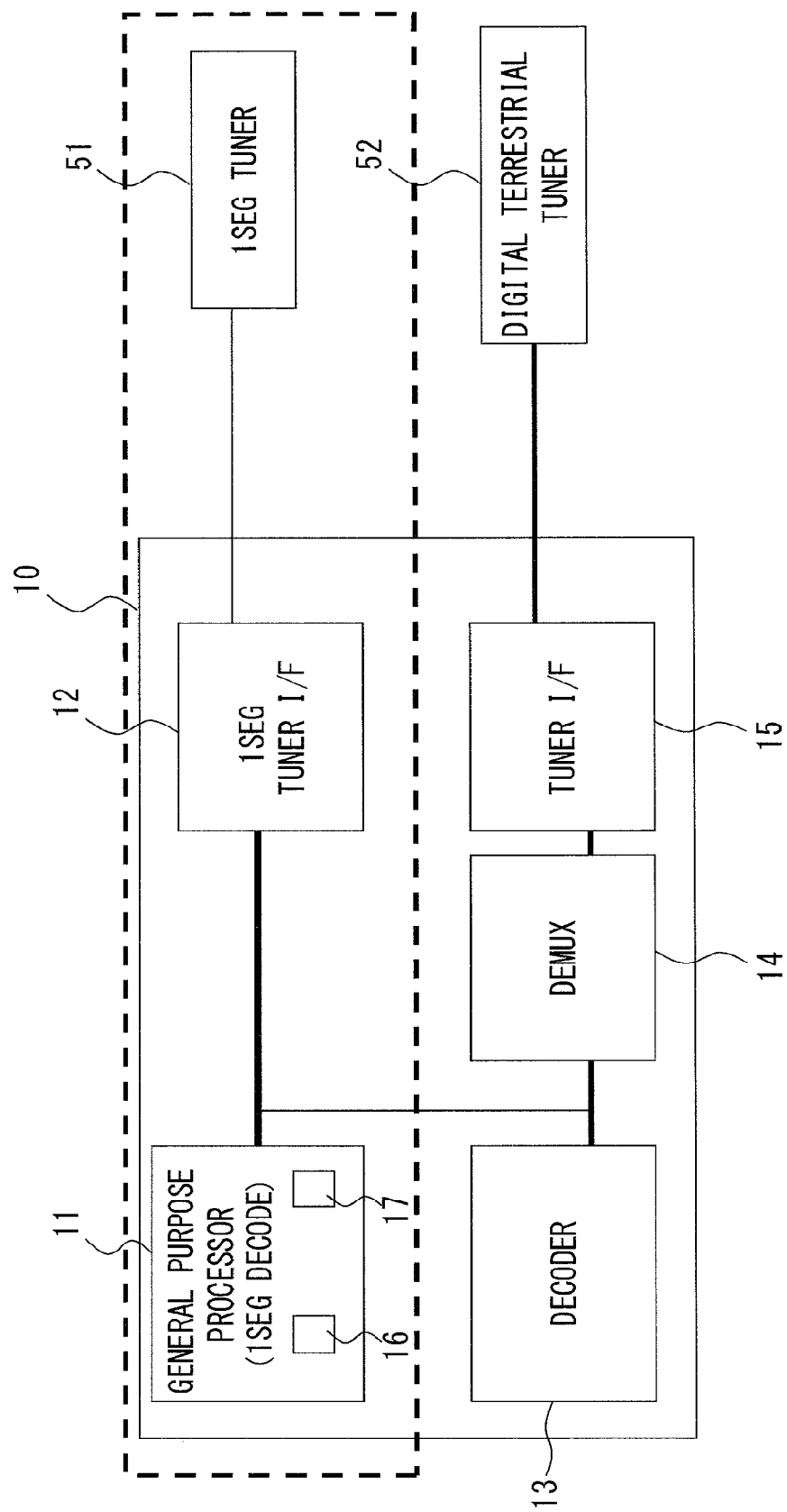
FIG. 5 is a block diagram for explaining reception switch by the semiconductor device.
Figure 6:
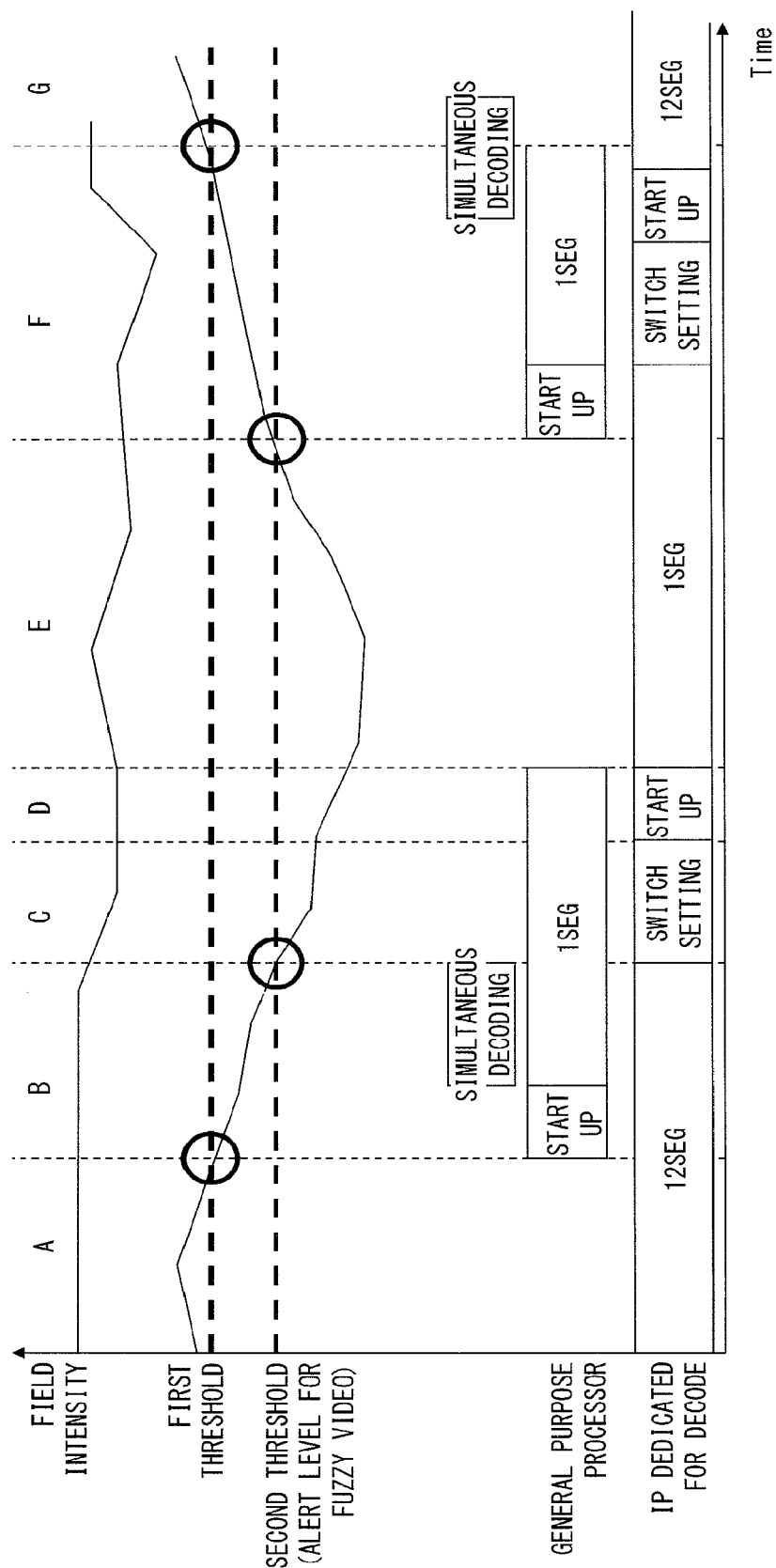
FIG. 6 explains an operation of the reception switch.

Hereinafter, a signal processing method of the semiconductor device 10 according to this embodiment is explained using FIGS. 1 to 6. FIGS. 2 to 5 are block diagrams of the semiconductor device 10 for explaining a process flow and are similar to the block diagram of FIG. 1. FIG. 6 shows changes in field intensity of the 12 seg broadcast waves and switches of the decode operation.

When the field intensity of the 12 seg broadcast waves is sufficient, the decoder 13 decodes only the 12 seg broadcast signals (period A in FIG. 6). At this time, the decoder 13, the demultiplexer 14, the tuner I/F 15, and the digital terrestrial tuner 52 operate and decode the 12 seg broadcast signals (see the dotted rectangle in FIG. 1). In the period A in FIG. 6, the general purpose processor 11 is not performing the decode process, thus the general purpose processor 11 can perform other processes. Thus, the process load of the general purpose processor 11 can be reduced.

When the field intensity of the 12 seg broadcast wave falls below a first threshold, the general purpose processor 11 starts up the decode process of the 1 seg broadcast signals (period B in FIG. 6). Then, the decoding unit 17 in the general purpose processor 11 decodes the 1 seg broadcast signals transmitted from the 1 seg tuner 51 to the 1 seg tuner I/F 12. In this example, the general purpose processor 11 and the 1 seg tuner I/F 12 operate and decode the 1 seg broadcast signals from the 1 seg tuner 51 (see the dotted rectangle in FIG. 2). In the period B in FIG. 6, decoding of the 12 seg broadcast signals by the decoder 13 and decoding of the 1 seg broadcast signals by the general purpose processor 11 is performed in parallel. That is, the semiconductor device 10 simultaneously decodes the 12 seg broadcast signals and the 1 seg broadcast signals. Therefore, the compressed image data in a specific period is decoded by both the general purpose processor 11 and the decoder 13. Note that the general purpose processor 11 demultiplexes the 1 seg broadcast signals when the general purpose processor 11 is decoding the 1 seg broadcast signals. While the general purpose processor 11 and the decoder 13 simultaneously decode, the monitor displays content based on the 1 seg broadcast signals decoded by the general purpose processor 11.

For example, the switch unit 16 provided in the general purpose processor 11 compares the field intensity of the 12 seg broadcast waves and the first threshold. Then, the switch unit 16 outputs a signal indicating a comparison result to the general purpose processor 11, the decoder 13 and the like. When the field intensity of the 12 seg broadcast waves is greater than the first threshold, only the decoding of the 12 seg broadcast signal by the decoder 13 is performed. When the field intensity of the 12 seg broadcast waves falls below the first threshold, the decode unit 17 in the general purpose processor 11 starts decoding the 1 seg broadcast signals. In this way, the general purpose processor 11 determines whether or not to decode the 1 seg broadcast signals according to the comparison result between the field intensity of the 12 seg broadcast waves and the first threshold. Note that in the period B in FIG. 6, the decoding of the 12 seg broadcast signals by the decoder 13 is performed together with the decoding of the 1 seg broadcast signals by the general purpose processor 11.

Next, when the field intensity of the 12 seg broadcast waves falls below a second threshold, the display switches from the 12 seg broadcasting to the 1 seg broadcasting (boundary between the periods B and C in FIG. 6). That is, when the field intensity falls to a non-viewable region, the monitor display switches from the 12 seg broadcasting to the 1 seg broadcasting. As the general purpose processor 11 is already decoding the 1 seg broadcast signals, seamless switching of the broadcasting can be achieved.

Then, the decoder 13 performs switch setting from the 12 seg broadcasting to the 1 seg broadcasting (period C in FIG. 6). Specifically, the decoder 13 stops decoding the 12 seg broadcast signals, and performs a setup operation for decoding the 1 seg broadcast signals. To this end, the decoder 13 reads the configuration required for decoding the 1 seg broadcast signals. The monitor displays the content based on the 1 seg broadcast signals decoded by the decode unit 17 in the general purpose processor 11 even during the setup operation of the decoder 13.

More specifically, the switch unit 16 compares the second threshold (alert level for fuzzy video) and the field intensity of the 12 seg broadcast waves. Then, the switch unit 16 outputs the signal indicating the comparison result to the general purpose processor 11, the decoder and the like. When the field intensity of the 12 seg broadcast waves falls below the second threshold, the broadcasting is switched to the 1 seg broadcasting. Specifically, the monitor displays the content of the 1 seg broadcasting. Note that the second threshold is less than the first threshold.

Further, when the switch setting of the decoder 13 is completed, the decoder 13 starts up the decode process of the 1 seg broadcast signals (period D in FIG. 6). Note that also in the periods C and D in FIG. 6, the general purpose processor 11 is decoding the 1 seg broadcast signals. Accordingly, the compressed image data included in the 1 seg broadcast signals is decoded by the general purpose processor 11.

When the decoder 13 starts decoding the 1 seg broadcast signals (boundary between the periods D and E in FIG. 6), the monitor displays the content based on the 1 seg broadcast signals decoded by the decoder 13 (period E in FIG. 6). At this time, the decode unit 17 in the general purpose processor 11 stops the decode process. For example, when the decoder 13 starts up the decode process of the 1 seg broadcast signals, the decoder 13 transmits a signal indicating of the ongoing decode process of the 1 seg broadcast signals to the general purpose processor 11. Then, while the monitor displays the content based on the 1 seg broadcast signals decoded by the decoder 13, the general purpose processor 11 stops the decode process of the 1 seg broadcast signals. By providing the period for simultaneous decoding in the abovementioned manner, it is possible to seamlessly switch the broadcasting even in the case there are several frames of overhead. That is, as the decoding is performed for one of 1 seg and 12 seg broadcast signals at all times, it is possible to eliminate time when the monitor is unable to display the content.

Figure 4:
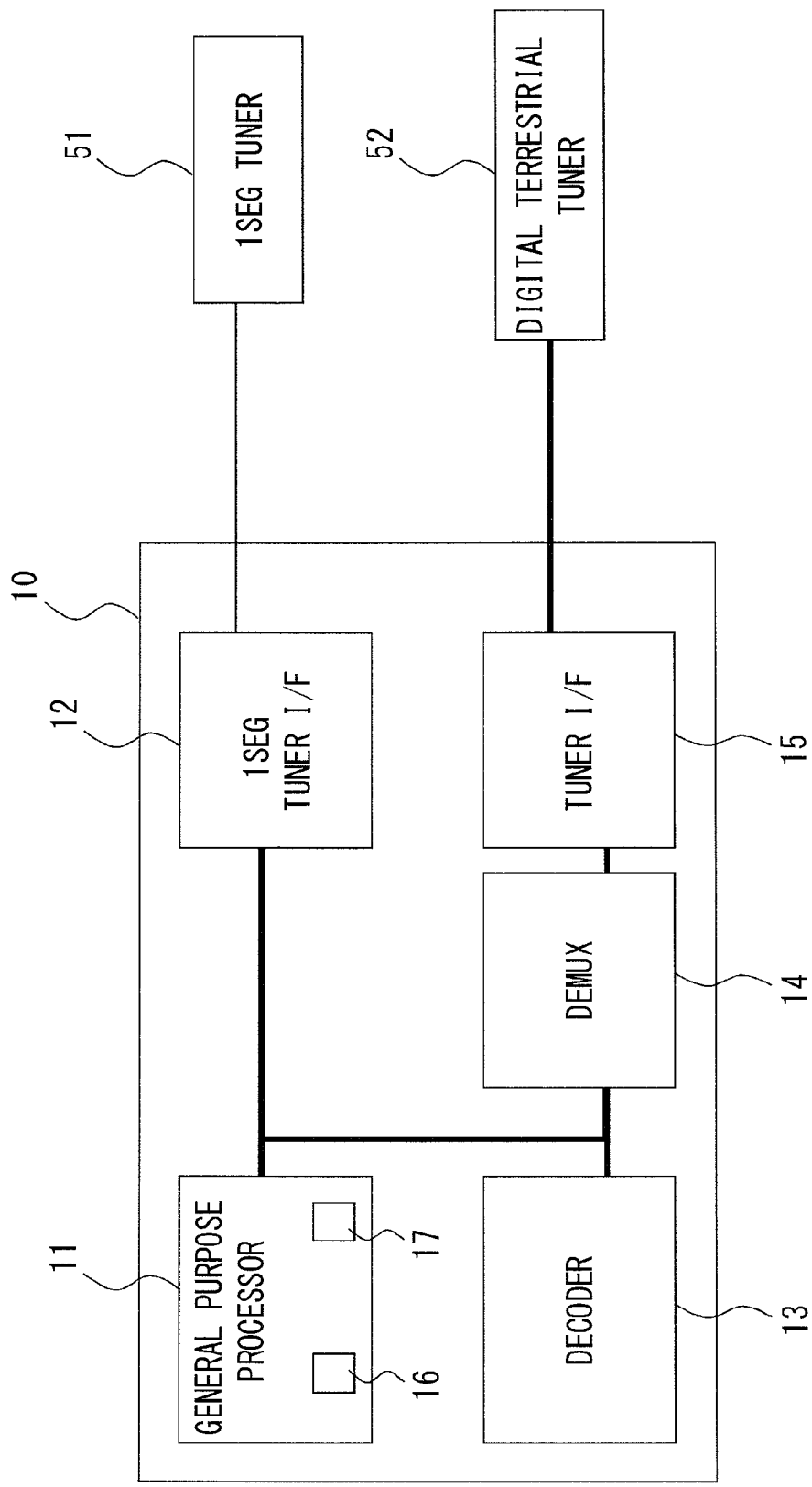
FIG. 4 is a block diagram for explaining reception switch by the semiconductor device.

In this example, as shown in FIG. 4, the 1 seg broadcast signals from the 1 seg tuner I/F 12 are supplied to the demultiplexer 14. Then, the decoder 13 decodes the 1 seg broadcast signals demultiplexed by the demultiplexer 14. In the period E in FIG. 6, the general purpose processor 11 is not performing the decode process. This reduces the process load of the general purpose processor 11 and enables the general purpose processor 11 to perform other processes than the decode process.

Note that after the field intensity falls below the first threshold, when the field intensity returns greater than or equal to the first threshold without falling below the second threshold, the general purpose processor 11 stops the decode process of the 1 seg broadcast signals. That is, in such a case, after the general purpose processor 11 starts decoding the 1 seg broadcast signals, the decoder 13 will not decode the 1 seg broadcast signals. In other words, the monitor will not display the content based on the 1 seg broadcast signals decoded by the general purpose processor 11 and continue to display the content of the 12 seg broadcasting decoded by the decoder 13.

On the other hand, when the field intensity of the 12 seg broadcast waves returns to the second threshold after falling below the second threshold (boundary between the periods E and F in FIG. 6), the general purpose processor 11 starts up the decode process of the 1 seg broadcast signals (period F in FIG. 6). Then, as shown in FIG. 5, the general purpose processor 11 decodes the 1 seg broadcast signals supplied from the 1 seg tuner 51 to the 1 seg tuner I/F 12. More specifically, the switch unit 16 compares the field intensity of the 12 seg broadcast waves and the second threshold. After that, the switch unit 16 outputs a signal indicating the comparison result to the general purpose processor 11 and the decoder 13. When the field intensity of the 12 seg broadcast waves exceeds the second threshold, the general purpose processor 11 starts decoding the 1 seg broadcast signals.

When the general purpose processor 11 completed to start up the decode process of the 1 seg broadcast signals, the decoder 13 performs switch setting of the decode process. That is, after the general purpose processor 11 starts up the decode process, the monitor displays the content based on the 1 seg broadcast signals decoded by the general purpose processor 11. As described above, while the decoder 13 decodes the 1 seg broadcast signals, the general purpose processor 11 starts decoding the 1 seg broadcast signals. This allows seamless switching.

Then, the decoder 13 starts the decode process of the 12 seg broadcast signals. To this end, the decoder 13 reads the configuration required for decoding the 12 seg broadcast signals. During the setup operation of the decoder 13, the decoding unit 17 in the general purpose processor 11 is decoding the 1 seg broadcast signals. The decoder 13 starts up the decode process of the 12 seg broadcast signals and decodes the 12 seg broadcast signals. Accordingly, the decoding of the 12 seg broadcast signal by the decoder 13 and the decoding of the 1 seg broadcast signals by the general purpose processor 11 is performed in parallel. When the field intensity of the 12 seg broadcast signals exceeds the first threshold (boundary between the periods F and G in FIG. 6), the monitor displays the content based on the 12 seg broadcast signals decoded by the decoder 13. In addition, the general purpose processor 11 ends the decode process. The switch unit 16 switches the decoding according to the comparison result between the signal intensity of the digital terrestrial broadcast waves and the thresholds.

Note that the field intensity may fall to the second threshold after exceeding the second threshold without returning to the first threshold. In this case, when the field intensity falls below the second threshold, the decoder 13 starts up the decode process of the 1 seg broadcast signals in a similar manner as in the periods C and D in FIG. 6. Then, after the decoder 13 starts decoding the 1 seg broadcast signals, the general purpose processor 11 stops the decode process as in the period E.

As described above, when the field intensity of the 12 seg broadcast signals is between the first threshold and the second threshold, the general purpose processor 11 and the decoder 13 are controlled to perform the decode process in parallel. In other words, as the general purpose processor 11 decodes the 1 seg broadcast signals, a period is provided for decoding the 12 seg broadcast signals and the 1 seg broadcast signals simultaneously. When the field intensity falls below the second threshold in the period of simultaneous decoding, the monitor display is switched. That is, the monitor display is switched from the 12 seg broadcast signals to the 1 seg broadcast signals. On the contrary, when the field intensity exceeds the first threshold in the period of simultaneous decoding, the monitor display is switched from the 1 seg broadcast signals to the 12 seg broadcast signals. This allows seamless switching of broadcasting. Further, when the field intensity of the 12 seg broadcast signals is greater than the first threshold or lower than the second threshold, the general purpose processor 11 stops the decode process. This reduces the period of simultaneous decoding and thereby also reduces the power consumption. Then, the process load of the general purpose processor 11 can be reduced.

The general purpose processor 11 can decode the 1 seg broadcast signals and unable to decode the 12 seg broadcast signals. To put it another way, it is not necessary for the general purpose processor 11 to have a decoding function of the 12 seg broadcast signals. This eliminates the need for providing the general purpose processor 11 with high throughput for the decode process. That is, the general purpose processor 11 with high throughput is no longer necessary, and thus achieving reduction in the cost. Additionally, the general purpose processor 11 that performs processes other than the decoding will not perform the decode process of the 12 seg broadcast signals, which imposes heavy processing load, thereby preventing an increase in the power consumption.

Since the general purpose processor 11 does not decode the 12 seg broadcast signals, it is possible to prevent a bus band from being occupied. For example, when a general purpose CPU decodes the 12 seg broadcast signals, 500 MB/sec of the bus band is occupied. In this embodiment, as the general purpose processor 11 decodes only the 1 seg broadcast signals, necessary bus band is only 16.1 MB/sec. This achieves reduction in the cost of the semiconductor device 10.

Further, only one dedicated decoder IP provided in the semiconductor device 10 enables appropriate switching of broadcasting. When the decoder 13 switches the decoding, the general purpose processor 11 is decoding the 1 seg broadcast signals. In the region or state with low signal intensity of the 12 seg broadcast waves, the content is displayed based on the 1 seg broadcast waves. This prevents frame dropping by the overhead at the time of switching and enables seamless switching of broadcasting. Additionally, as only one decoder 13 needs to be provided, an increase in the size of SoC can be prevented. Moreover, an external LSI is no longer necessary, thus the cost can be reduced. Furthermore, the decoder 13 can be composed of a dedicated decoder IP, thereby suppressing the increase in the power consumption of the decoder 13 for decoding the 12 seg broadcast signals.

Only an input terminal provided in the semiconductor device 10 for receiving a field intensity signal indicating the signal intensity of the digital terrestrial broadcast waves enables switching of the broadcasting. Therefore, simple configuration can achieve easy broadcast switching. The first and second thresholds may be changed as appropriate. This achieves more appropriate broadcast switching.

Incidentally, fluctuation in the field intensity of the 12 seg broadcast waves near the threshold leads to frequent switching processes. The field intensity of the 12 seg broadcast waves repeatedly exceeds or falls below the thresholds in a short cycle. This leads to frequent switching processes, and therefore an increase in the power consumption. In order to prevent such frequent switching, it is preferable to use a signal obtained by integrating the field intensity of the 12 seg broadcast waves as a signal intensity signal. That is, the field intensity of the 12 seg broadcast waves is integrated for a certain time to suppress the fluctuation in the signal intensity signal.

Second Embodiment

As mentioned above, changing the first and second thresholds enables more appropriate broadcast switching. For example, the thresholds may be changed according to whether a motor vehicle with a car navigation system mounted thereon that includes the semiconductor device of this embodiment is travelling in a city or a mountain area. In addition, the thresholds may be changed according to the speed of the motor vehicle and weather. By the semiconductor device of this embodiment used in a control semiconductor chip for controlling the navigation system, it is possible to switch the broadcasting more appropriately. In this way, the semiconductor device of this embodiment used as the control chip for the navigation system achieves more appropriate switching.

Figure 7:
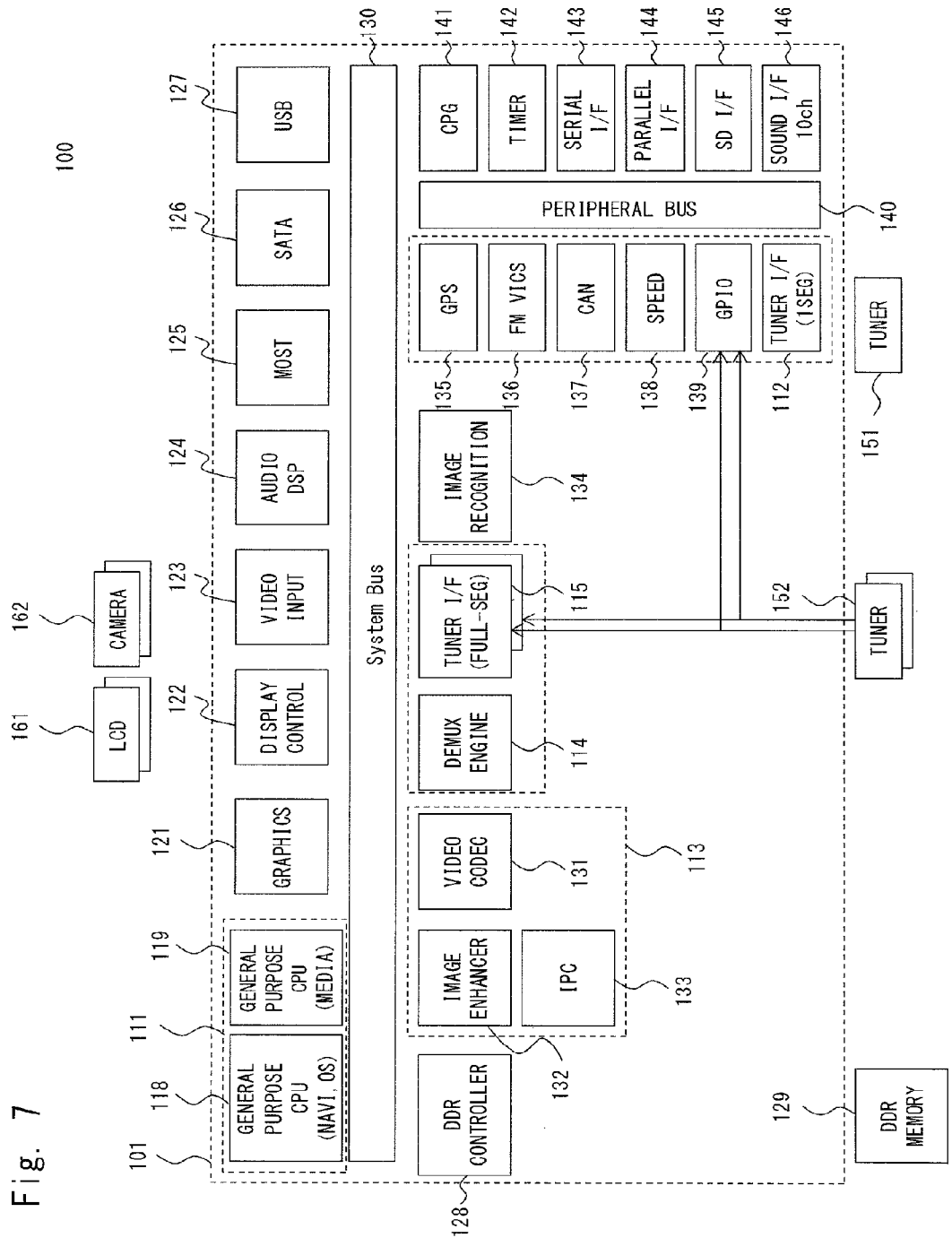
FIG. 7 is a block diagram showing a configuration of a navigation system using a semiconductor device according to a second embodiment.

Hereinafter, a configuration of the semiconductor device used as the control chip for the navigation system is explained with reference to FIG. 7. FIG. 7 is a block diagram showing a configuration of a control system of a navigation system 100 according to this embodiment. Note that the signal processing for switching the broadcasting is similar to the first embodiment, thus the explanation will not be repeated here. That is, processes other than changing the thresholds are similar to the first embodiment.

A semiconductor device 101 includes a general purpose CPU 111, a decoder 113, a demultiplexer 114, a tuner I/F 115, a graphic module 121, a display control module 122, a video input module 123, an audio DSP (Digital Signal Processor) 124, a MOST (Media Oriented System Transport) module 125, an SATA (Serial Advanced Technology Attachment) module 126, a USB (Universal Serial Bus) module 127, a DDR controller 128, a system bus 130, an image recognition module 134, a GPS (Global Positioning System) module 135, an FM VICS® (Frequency Modulation Vehicle Information and Communication System) module 136, a CAN module 137, a Speed module 138, a GPIO (General Purpose Input Output) 139, a 1 seg tuner I/F 112, a peripheral bus 140, a CPG (Clock Pulse Generator) module 141, a timer 142, a serial I/F 143, a parallel I/F 144, an SD card I/F 145, and a sound I/F 146. Note that each module of the semiconductor device is configured as an IP core, for example.

The decoder 113 corresponds to the decoder 13 of the first embodiment and selectively decodes the 1 seg broadcast signals and 12 seg broadcast signals. The decoder 113 includes a video codec 131, an image enhancer 132, and an IPC (Interlace Progressive Conversion) module 133. The general purpose CPU 111 corresponds to the general purpose processor 11 of the first embodiment and is a control processor of the navigation system. The general purpose CPU 111 includes a navigation and OS processing block 118 and a media processing block 119. Note that the OS is Windows®, Linux®, iTron and the like.

The navigation and OS processing block 118 entirely controls each module (block) regarding the navigation mentioned later. That is, a navigation function is realized by comprehensive control on the later mentioned modules by the navigation and the OS processing block 118. For example, the navigation and the OS processing block 118 displays a current position of a travelling motor vehicle on a map displayed on the liquid crystal display monitor 161. Further, the navigation and the OS processing block 118 performs setting of a destination and processes concerning route finding and the like.

The media processing block 119 entirely controls the modules (blocks) regarding the digital terrestrial broadcasting. That is, as the media process block 110 comprehensively controls the later mentioned modules, the content of the digital terrestrial broadcasting can be displayed on the liquid crystal display monitor 161. For example, the media processing block 119 displays on the liquid crystal display monitor 161 video of content broadcasted in the digital terrestrial broadcasting and outputs audio of the content broadcasted in the digital terrestrial broadcasting from a speaker not shown. The media processing block 119 functions as the decoder 13 and the switch unit 16 of the first embodiment.

The liquid crystal display monitor 161, a camera 162, a DDR memory 129, and a tuner 152 are provided in the navigation system 100. The liquid crystal display monitor 161, the camera 162, the DDR memory 129, the tuner 151, and the tuner 152 are connected to the semiconductor device 101 and controlled by the general purpose CPU 111. The camera 162 is, for example, a camera for rear view that is mounted on the motor vehicle. The liquid crystal display monitor 161 is a monitor for displaying a map of the navigation system or an image and the like captured by the camera 162. Not to mention that the liquid crystal display monitor 161 may be other monitors such as an organic electroluminescence monitor.

The tuner 151 is similar to the abovementioned 1 seg tuner I/F 12 and tunes in the 1 seg broadcast waves. The tuner 152 is similar to the tuner I/F 15 of the first embodiment and tunes in the 12 seg broadcast wave. Note that the navigation system 100 includes a plurality of tuners 152. Therefore, the navigation system 100 also has a plurality of tuner I/Fs 115. The tuners 151 and 152 may demodulate the 12 seg broadcast waves and the 1 seg broadcast waves, or a demodulator may be provided separately.

The graphic module 121 is a graphic engine that performs processes for generating display data to be displayed on the liquid crystal display monitor 161. The graphic module 121 generates data for navigation maps from map information stored to an SD card, a DVD-ROM, or a hard disk drive. The display control module 122 generates display signals based on the display data generated by the graphic module 121 and outputs the display signals to the liquid crystal display monitor 161. Then, the liquid crystal display monitor 161 displays a desired image. The video input module 123 receives data captured by the camera 162. The audio DSP 124 performs digital signal processing for outputting and inputting audio data.

The MOST module 125 is connected to MOST mounted on the motor vehicle. The MOST builds a network for connecting onboard multimedia devices. The MOST module 125 performs processes to signals output to MOST or signals received from MOST. The SATA module 126 is connected to the various drives including a hard disk drive, an optical disk drive and the like. The SATA module 126 performs processes to signals output to the various drives or the signals received from the various drives. The USB module 127 is connected to a USB device such as a USB memory. The USB module 127 performs processes to signals output to the USB device or signals received from the USB device.

The DDR controller 128 controls reading and writing process from and to the external DDR (Double Data Rat) memory 129. The DDR controller 128 writes, for example, the map information and content information to the DDR memory 129 or reads the information from the DDR memory 129. The decoder 113 corresponds to the decoder 13 of the first embodiment and selectively decodes the 12 seg broadcast signals and 1 seg broadcast signals. The decoder 113 includes the video codec 131, the image enhancer 132, and the IPC module 133. The video codec 131 encodes and decodes video data. The image enhancer 132 performs image processing to the decoded image and reduces jaggies. The IPC module 133 converts an interlaced signal into a progressive signal.

The GPS module 135 locates positions based on the signals from a GPS satellite. Then, the position coordinates of the motor vehicle with the car navigation system mounted thereon are measured. The FM VICS® module 136 performs processes to VICS® information received by an FM antenna (not shown) and outputs the processed information to the graphic module 121. Then, the VICS® information can be displayed on the liquid crystal display monitor 161. The image recognition module 134 is an image recognition engine that performs an image recognition process to the image captured by the camera 162. For example, the image recognition module 134 performs a process to the image captured by the camera 162 in order to recognize lanes, street signs and the like.

The CAN module 137 is connected to CAN mounted on the motor vehicle. CAN builds a network concerning cruise control of the motor vehicle. The CAN module 137 performs processes to signals output to CAN or the signals received from CAN. The Speed module 138 receives vehicle speed pulses from the motor vehicle and calculates the speed of the motor vehicle based on the vehicle speed pulses. The travelling speed of the motor vehicle can be obtained in this way. The current position of the motor vehicle may be estimated based on the vehicle speed of the motor vehicle detected by the Speed module 138. The GPIO 139 includes an input and output terminal and is an interface with an external device. For example, the field intensity signal is supplied to the GPIO 139 from the tuner 152.

The CPG module 141 generates a clock pulse and outputs the clock pulse to each module as appropriate. When the process load of the general purpose CPU 111 increases, the timer 142 will be a timer for terminating the general purpose CPU 111 and performing an interruption process. The serial I/F 143 will be an interface such as operation buttons for an input and output device. The parallel I/F 144 will be an interface for the DDR memory 129, RAM and the like. The SD card I/F 145 is an interface for an SD card inserted into a card slot. The sound I/F 146 will be an interface for a microphone and a speaker not shown. Thus, audio signals of navigation guidance and the content are output from the sound I/F 146 to the speaker not shown. Each of the abovementioned blocks (modules) is connected via the system bus 130 or the peripheral bus 140, and the signals are transmitted and received via the buses.

Further, in a similar manner as the first embodiment, control for displaying the digital terrestrial broadcasting is performed. Specifically, the semiconductor device 101 switches the decode process according to the signal intensity of the 12 seg broadcast waves. For example, when the signal intensity of the 12 seg broadcast waves is low, the content transferred in the ground digital broadcasting is displayed based on the 1 seg broadcast waves. At the time of switching the decoding by the decoder 113 from the 12 seg broadcast signals to the 1 seg broadcast signals, in a similar manner as the first embodiment, the decoding of the 1 seg broadcast signals by the general purpose CPU 111 and the decoding of the 12 seg broadcast signals by the decoder 113 is performed simultaneously. Similarly, at the time of switching the decoding by the decoder 113 from the 1 seg broadcast signals to the 12 seg broadcast signals, in a similar manner as the first embodiment, the decoding of the 1 seg broadcast signals by the general purpose CPU 111 and the decoding of the 12 seg broadcast signals by the decoder 113 is performed simultaneously. Then, it is possible to achieve the same advantages as the first embodiment. Note that as the switching control is similar to that of the first embodiment, detailed explanation will not be repeated here.

Moreover, in this embodiment, the thresholds used for switching the decode process are changed as appropriate. That is, the first threshold for evaluating whether or not to perform the decoding by the general purpose CPU 111 and the second threshold for evaluating whether or not to switch the decoding by the decoder 113 are changed. Arbitrarily changing the thresholds allows the semiconductor device 101 to appropriately switch the decode process.

The thresholds may be switched depending on the location positioned by the GPU module 135 and the like. For example, the GPS module 135 evaluates whether the motor vehicle is in a city or a suburban area with reference to the map information of the navigation system. The signal intensity of the 12 seg broadcast waves tends to fall, for example, in cities surrounded by multistory buildings, tunnels, and mountainous areas due to obstacles. Therefore, such places where the signal intensity falls are registered to the map information beforehand. The thresholds are changed when the motor vehicle enters the previously registered area. For example, the thresholds are changed higher in the place where the signal intensity tends to fall due to the obstacles. In this way, the content is displayed based on the 1 seg broadcast waves that provide wider reception area in the place that tends to have lower signal intensity. Moreover, the broadcasting is interrupted near the border between prefectures, for instance, where broadcast channels switch. Therefore, the thresholds are changed higher near the border between prefectures in order to decode the 1 seg broadcast signals with wider reception area. As has been explained, the thresholds can be changed with reference to the map information of the navigation system and the current position of the motor vehicle.

Furthermore, temperature information and weather information may be acquired from OS, and the thresholds may be changed higher or lower depending on the information. For example, as the signal intensity of the 12 seg broadcast waves falls in fog, the thresholds are changed higher. Therefore, the decoding can be switched to the 1 seg broadcast signals. Alternatively, the thresholds may be changed according to temperature, ultraviolet rays (sunlight) and the like.

In addition, the thresholds may be adjusted according to the speed acquired by the Speed module 138. For example, the motor vehicle can stably receive the broadcast waves while travelling at a low speed. In such a case, the thresholds may be reduced. Moreover, when the motor vehicle travels at a high speed, the broadcasting may not be switched upon instantaneous wave interruption. As described so far, the thresholds are preferably changed according to at least one of the temperature information, the weather information, the speed information, and the position information that is supplied to the processor. This allows the semiconductor device 101 to appropriately switch the decoding process according to the travelling environment.

Incidentally, the signal intensity may instantaneously change by noise. Upon such an instantaneous change in the signal intensity, it is preferable to control the general purpose CPU 111 not to perform the decode process. This contributes to further reduction in the power consumption. In other words, the power consumption increases by the general purpose CPU 111 starting the decode process at every sudden change in the signal intensity. This increases the number of times for the general purpose CPU 111 to start the decode process. Consequently, there may be excessive simultaneous decoding by the general purpose CPU 111 and the decoder 113. For this reason, it is preferable that the general purpose CPU 111 is prevented from starting the decode process when the signal intensity is instantaneously reduced by noise. In order to do that, the integrated value of the field intensity and the thresholds are compared. Then, the power consumption can be reduced. This further reduces the process load of the general purpose CPU 111.

The reception environment of the broadcast waves may change along with a movement of the motor vehicle. There are a case when the motor vehicle moves from an environment with high field intensity to an environment with low field intensity and a case when the motor vehicle moves from the environment with low field intensity to the environment with high field intensity. In particular, the reception status of the in-vehicle devices may instantaneously improve or deteriorate due to the high travelling speed of the motor vehicle. In order to deal with this issue, the general purpose CPU 111 integrates the field intensity in immediate certain period of time. Then, the integrated value and the thresholds are compared to control switching of the broadcasting. This enables prevention of switching caused by temporary noise and an influence of disturbances including geographical feature and wave interruption by obstacles. Further, in the case of instantaneous deterioration of the reception status, a video processing engine operating in the general purpose CPU 111 is controlled to drop frames, for example. This allows prevention of sudden switch between the 12 seg broadcasting and the 1 seg broadcasting.

Furthermore, as the noise, there are circuit noise and environmental noise. The circuit noise is generated inside the semiconductor device 101. That is, the input field intensity may change due to noise in the I/F units and internal circuits even when the reception environment of the broadcast waves remains unchanged. The integrated value of the field intensity signal and the thresholds are compared in order to prevent switching of the decode process due to the circuit noise. Then, the circuit noise can be detected, and thereby preventing an erroneous change of the operating state.

As the environmental noise, there is instantaneous fluctuation in the field intensity by the obstacles, geographical features, weather, and travelling speed, as mentioned above. When the motor vehicle moves from the environment with high field intensity to the environment with low field intensity, only the preparation for the decode process by the general CPU 111 is performed. When the integrated value continues to decrease and falls to less than or equal to the first threshold, the general purpose CPU 111 starts the decode process. In the case of the movement from the environment with low field intensity to the environment with high field intensity, the general purpose CPU 111 prepares for the decode process upon a sudden increase in the field intensity. When the integrated value continues to increase, the decoder starts up the decode process of the 12 seg broadcast signals. When the integrated value exceeds the first threshold, the general purpose processor 11 ends the decode process.

Note that the semiconductor device according to this embodiment may be mounted on a navigation system other than the car navigation system mounted on the motor vehicle. For example, the semiconductor device can be mounted on cellular phones including smartphones.

TV broadcasting system depends on a country. For example, ISDB-T (Integrated Services Digital Broadcasting-Terrestrial) is used for the second broadcasting waves and a part of ISDB-T is used for the first broadcasting waves in Japan. In Europe, DVB-T (Digital Video Broadcasting-Terrestrial) is used for the second broadcasting waves and DVB-H (Digital Video Broadcasting-Handheld) is used for the first broadcasting waves. In South America counties such as Brazil, ISDB-TB is used for the second broadcasting waves and a part of ISDB-TB is used for the first broadcasting waves. In South Korea, ATSC (Advanced Television Systems Committee) standards is used for the second broadcasting waves and T-DMB (Terrestrial-Digital Media Broadcasting) is used for the first broadcasting waves. In China, CDMB (China Digital Multimedia broadcasting)-T is used for the second broadcasting waves and CMMB (China Mobile Multimedia broadcasting) is used for the first broadcasting waves. In the United States, ATSC is used for the second broadcasting waves. In Middle East, Southeastern Asia, South Africa, Australia and so on, DVB-T is used for the second broadcasting waves and DVB-H is used for the first broadcasting waves. It is possible to select the compliant broadcasting system based on the country where the semiconductor device is used. The semiconductor device decodes the first and second broadcasting waves in accordance with the broadcasting system. As a matter of course, another broadcasting system may be used for first broadcasting waves or the second broadcasting waves.

The first and second embodiments can be combined as desirable by one of ordinary skill in the art.

Note that the present invention is not limited to the above embodiments but may be changed as appropriate within the range not departing from the scope.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor integrated circuit device provided in a semiconductor chip, comprising:
   a first tuner interface configured to be coupled to a first tuner for receiving a first broadcast wave transferring first content data;
   a second tuner interface configured to be coupled to a second tuner for receiving a second broadcast wave transferring second content data;
   a general purpose processor configured to decode a first broadcast signal supplied from the first tuner interface; and
   a decoder configured to decode the first broadcast signal and a second broadcast signal supplied from the second tuner interface,
   wherein an amount of the first content data transferred per unit time is smaller than that of the second content data, wherein the general purpose processor and the decoder are configured to decode the first broadcast signal and the second broadcast signal, respectively, in a same period, and wherein the general purpose processor has a function of determining which of the first and second broadcast signals the decoder decodes based on a field intensity of the second broadcast wave.

2. The semiconductor integrated circuit device according to claim 1, wherein the general purpose processor starts to decode the first broadcast signal when a field intensity of the second broadcast wave falls below a first threshold level, and wherein the decoder starts to decode the first broadcast signal when a field intensity of the second broadcast wave falls below a second threshold level which is lower than the first threshold level.

3. The semiconductor integrated circuit device according to claim 2, wherein each of the first and second threshold levels is variable.

4. The semiconductor integrated circuit device according to claim 3, wherein the general purpose processor is a control processor of an on-board navigation system, and wherein the first and second threshold levels change according to at least one of weather information, speed information, and position information supplied to the general purpose processor.

5. The semiconductor integrated circuit device according to claim 1, wherein the first and the second tuners are components of the on-board navigation system.

6. The semiconductor integrated circuit device according to claim 1, wherein the semiconductor integrated circuit device is configured to be employed in a car navigation system.

7. The semiconductor integrated circuit device according to claim 1, wherein the semiconductor integrated circuit device is configured to be employed in a mobile phone.

8. The semiconductor integrated circuit device according to claim 1, wherein the general purpose processor and the decoder are configured to decode the first broadcast signal and the second broadcast signal simultaneously in the same period.

* * * * *